United States Patent
Li et al.

(10) Patent No.: US 10,031,732 B1
(45) Date of Patent: Jul. 24, 2018

(54) OPERATION PROCESSING FOR HIGH LEVEL SYNTHESIS

(71) Applicant: Xilinx, Inc., San Jose, CA (US)

(72) Inventors: Dong Li, Beijing (CN); Sheng Zhou, San Mateo, CA (US); Stephen A. Neuendorffer, San Jose, CA (US)

(73) Assignee: XILINX, INC., San Jose, CA (US)

( * ) Notice: Subject to any disclaimer, the term of this patent is extended or adjusted under 35 U.S.C. 154(b) by 8 days.

(21) Appl. No.: 15/226,768

(22) Filed: Aug. 2, 2016

(51) Int. Cl.
*G06F 8/41* (2018.01)
*G06F 8/70* (2018.01)

(52) U.S. Cl.
CPC .............. *G06F 8/443* (2013.01); *G06F 8/70* (2013.01)

(58) Field of Classification Search
CPC .................................. G06F 8/443; G06F 8/70
USPC ............................................................ 717/160
See application file for complete search history.

(56) References Cited

U.S. PATENT DOCUMENTS

| | | | |
|---|---|---|---|
| 5,499,192 A | 3/1996 | Knapp et al. | |
| 5,648,913 A | 7/1997 | Bennett et al. | |
| 5,659,484 A | 8/1997 | Bennett et al. | |
| 5,752,035 A | 5/1998 | Trimberger | |
| 6,086,629 A | 7/2000 | McGettigan et al. | |
| 6,216,258 B1 * | 4/2001 | Mohan | G06F 17/5054 716/117 |
| 6,216,259 B1 | 4/2001 | Guccione | |
| 6,237,129 B1 | 5/2001 | Peterson et al. | |
| 6,243,851 B1 | 6/2001 | Hwang et al. | |
| 6,260,182 B1 | 7/2001 | Mohan et al. | |
| 6,292,925 B1 | 9/2001 | Dellinger et al. | |
| 6,408,422 B1 | 6/2002 | Hwang et al. | |
| 6,430,732 B1 | 8/2002 | Hwang et al. | |
| 6,457,164 B1 | 9/2002 | Hwang et al. | |
| 7,376,939 B1 | 5/2008 | Nayak et al. | |
| 7,506,278 B1 | 3/2009 | Rjimati et al. | |
| 7,509,619 B1 * | 3/2009 | Miller | G06F 17/505 703/13 |
| 7,558,719 B1 | 7/2009 | Donlin | |
| 7,979,835 B1 | 7/2011 | Schumacher et al. | |
| 7,984,412 B1 | 7/2011 | Schumacher et al. | |
| 8,127,262 B1 | 2/2012 | James-Roxby et al. | |
| 8,185,850 B1 | 5/2012 | Schumacher | |
| 8,296,710 B2 | 10/2012 | Liu et al. | |
| 8,881,079 B1 | 1/2014 | Pan et al. | |
| 8,875,073 B1 | 10/2014 | Sundararajan et al. | |
| 9,075,624 B2 | 7/2015 | Carrillo | |
| 9,081,925 B1 | 7/2015 | Schumacher et al. | |
| 9,081,930 B1 | 7/2015 | Neuendorffer et al. | |
| 9,117,046 B1 | 8/2015 | Schumacher et al. | |

(Continued)

OTHER PUBLICATIONS

Xilinx, "Vivado Design Suite User Guide," UG902 (v2012,2), Jul. 25, 2012, pp. 1-432, Xilinx, San Jose, California, USA.

*Primary Examiner* — Anna Deng
(74) *Attorney, Agent, or Firm* — Kevin T. Cuenot

(57) ABSTRACT

High level synthesis can include detecting, using a processor, an enumerated operation within an instruction of a loop construct of an application, determining, using the processor, whether the loop construct meets a modification condition, and responsive to determining that the loop construct meets the modification condition, modifying, using the processor, the loop construct to calculate the enumerated operation as a compile time constant, wherein the modified loop construct is functionally equivalent to the loop construct.

15 Claims, 2 Drawing Sheets

(56) References Cited

U.S. PATENT DOCUMENTS 9,165,143 B1 10/2015 Sanders et al.
9,218,443 B1 12/2015 Styles et al.
9,230,112 B1 1/2016 Peterson et al.

* cited by examiner

OPERATION PROCESSING FOR HIGH LEVEL SYNTHESIS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to computer aided design of integrated circuits and, more particularly, to implementing circuit designs using high level synthesis.

BACKGROUND

High-level synthesis or "HLS" is a computer-automated design process in which a description of desired behavior of a system is converted into a circuit design and/or circuitry. The description of the desired behavior is typically written as an application in a high level programming language such as C, C++, OpenCL, and so forth. The application may be translated into a circuit design that may be specified as a register transfer level (RTL) description. The circuit design describes a synchronous digital circuit in terms of the flow of digital signals between hardware registers and the operations performed on those signals. The circuit design may be processed (e.g., synthesized, placed, and routed) through a design flow. Further, the processed circuit design may be implemented within an integrated circuit.

SUMMARY

An embodiment includes a method of high level synthesis. The method can include detecting, using a processor, an enumerated operation within an instruction of a loop construct of an application and determining, using the processor, whether the loop construct meets a modification condition. The method can also include, responsive to determining that the loop construct meets the modification condition, modifying, using the processor, the loop construct to calculate the enumerated operation as a compile time constant, wherein the modified loop construct is functionally equivalent to the loop construct.

Another embodiment can include a system. The system can include a processor configured to initiate executable operations for high level synthesis. The executable operations can include detecting an enumerated operation within an instruction of a loop construct of an application, determining whether the loop construct meets a modification condition and, responsive to determining that the loop construct meets the modification condition, modifying the loop construct to calculate the enumerated operation as a compile time constant, wherein the modified loop construct is functionally equivalent to the loop construct.

Another embodiment can include a computer program product. The computer program product can include a computer readable storage medium having program code stored thereon. The program code is executable by a processor to perform operations for high level synthesis. The operations can include detecting, using the processor, an enumerated operation within an instruction of a loop construct of an application and determining, using the processor, whether the loop construct meets a modification condition. The executable operations further can include, responsive to determining that the loop construct meets the modification condition, modifying, using the processor, the loop construct to calculate the enumerated operation as a compile time constant, wherein the modified loop construct is functionally equivalent to the loop construct.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to computer aided design of integrated circuits (ICs) and, more particularly, to implementing circuit designs using high level synthesis. As discussed, high level synthesis is a computer-automated design process that converts a description of behavior of a digital system into a circuit design. The description is often specified as an application using a high level programming language (HLL). The circuit design generated from the description is specified as a register transfer level (RTL) description. The resulting circuit design, when implemented, is functionally equivalent to the description.

In many cases, the original description in HLL includes one or more operations that, when implemented as circuitry within a target IC, result in significant inefficiencies. For example, these operations, when implemented as circuitry may require a large number of resources in the target IC, have a large amount of latency, and/or consume a large amount of area in the target IC. In example embodiments described herein, these operations can be detected within the description or a derivative thereof. For example, constructs that include the enumerated operations can be modified to generate different and functionally equivalent constructs. The different constructs, when implemented as circuitry, require fewer resources, have less latency, and/or consume less area than had the original constructs (e.g., pre-modification) been implemented in original form as circuitry within the target IC.

Figure 1:
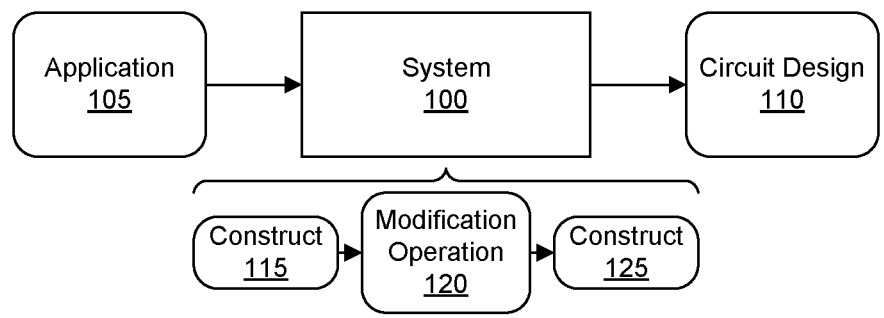
FIG. 1 is a block diagram illustrating an example of high level synthesis.

FIG. 1 is a block diagram illustrating an example of high level synthesis. As pictured, system 100 is configured to receive an application 105. Application 105 describes the behavior of a digital system. In one aspect, application 105 is specified in an HLL, e.g., as source code. Application 105 can be well-formed or syntactically correct. System 100 is capable of operating on application 105 to generate circuit design 110. In one aspect, circuit design 110 is written as an RTL description. The RTL description may be specified in a hardware description language (HDL).

As part of the high level synthesis performed, system 100 detects one or more enumerated operations of application 105. System 100, responsive to detecting the enumerated operations, is capable of modifying the construct(s) in which the detected operation(s) are located, thereby generating modified constructs. Referring to FIG. 1, system 100, in processing application 105, detects construct 115. Construct 115 includes an enumerated operation. Further, system 100 is capable of determining that construct 115 meets one or more modification conditions. In response to detecting construct 115 and/or determining that construct 115 meets the modification condition(s), system 100 can perform modification operation 120 on construct 115 to generate construct 125.

Construct 125 is functionally equivalent to construct 115. Construct 125, however, is implemented using at least one or more different instructions than construct 115. System 100 may continue performing synthesis on application 105 with construct 125 included therein in place of construct 115. In this manner, system 100 generates circuit design 110 from application 105 with modified construct 125. Modification operation 120 may be performed as a beginning or initial stage of a high level synthesis process.

In one example embodiment, system 100 operates on the source code of application 105. System 100, for example, may analyze the HLL source code of application 105, detect construct 115 specified as source code, and perform modification operation 120 on application 105 while in HLL format. In another example embodiment, system 100 may first generate an intermediate representation (IR) of application 105. For example, application 105 may be translated into a Low Level Virtual Machine (LLVM) Intermediate Representation (IR). In one aspect, the IR used is a static single assignment (SSA) compliant form. System 100 may analyze the IR of application 105, detect construct 115 within the IR, and perform modification operation 120 on the IR of application 105. System 100 may then generate circuit design 110 from the IR of application 105 having construct 125 included therein in IR form.

Figure 2:
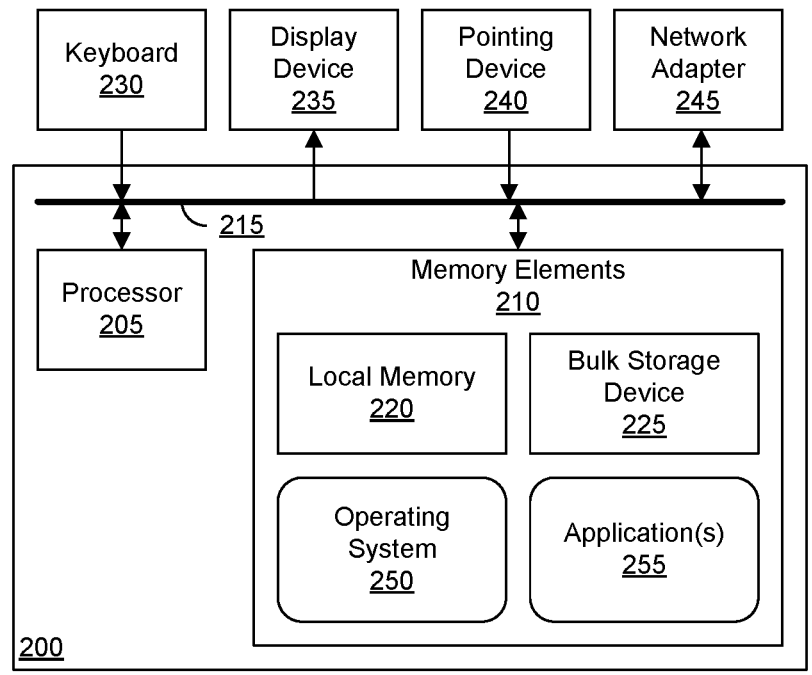
FIG. 2 is a block diagram illustrating an example architecture for a data processing system.

FIG. 2 is a block diagram illustrating an example architecture 200 for a data processing system. In one arrangement, architecture 200 can be used to implement system 100 of FIG. 1. In the example of FIG. 2, architecture 200 includes at least one processor 205 coupled to memory elements 210 through a system bus 215 or other suitable circuitry such as an input/output (I/O) subsystem. Architecture 200 stores computer readable instructions (also referred to as "program code") within memory elements 210. Memory elements 210 may be considered an example of computer readable storage media. Processor 205 executes the program code accessed from memory elements 210 via system bus 215.

Memory elements 210 include one or more physical memory devices such as, for example, a local memory 220 and one or more bulk storage devices 225. Local memory 220 refers to random access memory (RAM) or other non-persistent memory device(s) generally used during actual execution of the program code. Bulk storage device 225 may be implemented as a hard disk drive (HDD), solid state drive (SSD), or other persistent data storage device. System 200 may also include one or more cache memories (not shown) that provide temporary storage of at least some program code in order to reduce the number of times program code must be retrieved from bulk storage device 225 during execution.

Architecture 200 may be coupled to one or more I/O devices such as a keyboard 230, a display device 235, a pointing device 240, and/or one or more network adapters 245. Architecture 200 may include one or more additional I/O device(s) beyond the examples provided. The I/O devices described herein may be coupled to system 200 either directly or through intervening I/O controllers. In some cases, one or more of the I/O device(s) may be combined as in the case where a touch sensitive display device 235 (e.g., a touchscreen) is used. In that case, display device 235 may also implement keyboard 230 and/or pointing device 240.

Network adapter 245 is a communication circuit configured to establish wired and/or wireless communication links with other devices. The communication links may be established over a network or as peer-to-peer communication links. Accordingly, network adapter 245 enables architecture 200 to become coupled to other systems, computer systems, remote printers, and/or remote storage devices. Example network adapter(s) 245 may include, but are not limited to, modems, cable modems, Ethernet cards, bus adapters, connectors, and so forth. Network adapter 245 may be a wireless transceiver, whether a short and/or a long range wireless transceiver.

As pictured, memory elements 210 may store an operating system 250 and one or more application(s) 255. Application 255, for example, may be an electronic design automation (EDA) application. In one aspect, operating system 250 and application(s) 255, being implemented in the form of executable program code (e.g., compiled program code), are executed by architecture 200 and, more particularly, by processor 205, to perform the various operations described within this disclosure. As such, operating system 250 and application 255 may be considered an integrated part of a system implemented using architecture 200. Operating system 250, application 255, and any data items used, generated, and/or operated upon by a system using architecture 200 such as an application (e.g., application 255 and/or application 105), an IR of an application, a circuit design (e.g., circuit design 110), and so forth are functional data structures that impart functionality when employed as part of a data processing system or are provided to a target IC for implementation. A circuit design may be specified in RTL (e.g., Verilog, VHDL), as a netlist, a configuration bitstream, or in another format.

As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Architecture 200 may include fewer components than shown or additional components not illustrated in FIG. 2 depending upon the particular type of device that is implemented. In addition, the particular operating system and/or application(s) included may also vary according to device type as may the types of network adapter(s) included. Further, one or more of the illustrative components may be incorporated into, or otherwise form a portion of, another component. For example, a processor may include at least some memory.

Figure 3:
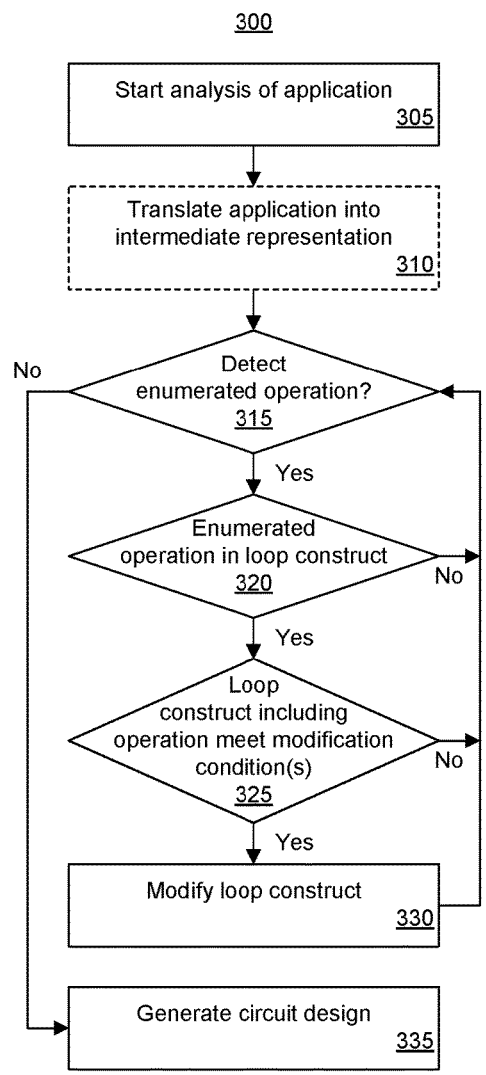
FIG. 3 is a flow chart illustrating an example method of high level synthesis.

FIG. 3 is a flow chart illustrating an example method 300 of high level synthesis. Method 300 can be performed by system 100 as described herein in connection with FIGS. 1 and/or 2. Method 300 may begin in a state where an application is selected for processing to undergo high level synthesis. Further, one or more operations have been enumerated within system 100 for detection and special handling in the context of high level synthesis as described herein in greater detail below.

In block 305, the system can start analysis of the application. In block 310, the system can translate the application into an IR. Translation of the application into an IR can be an optional operation. In one example, the system can analyze the HLL source code of the application. In that case, the system omits block 310 and performs the remainder of method 300 using the HLL source code of the application. In another example, the system may generate an IR of the application as described in block 310. The IR can conform to SSA. In that case, the system can perform the remainder of method 300 using the IR of the application.

In block 315, the system can detect an enumerated operation within the application. The system, for example, can analyze the instructions of the application to determine whether an enumerated operation is within an instruction. In one example, the enumerated operation is a modulo operation. In another example, the enumerated operation is a division operation. If an enumerated operation is detected, method 300 can continue to block 320. If not, method 300 can proceed to block 335.

In block 320, the system can determine whether the enumerated operation is located within a loop construct. The system can determine whether the enumerated operation is located within an instruction that is within a loop construct. In one arrangement, the system can determine whether the enumerated operation is within an instruction within a body of the loop construct. If the enumerated operation is within a loop construct, method 300 can continue to block 325. If not, method 300 can loop back to block 315.

As defined herein, the term "loop construct" means a plurality of instructions implemented in program code that cause a data processing system to execute one or more of the instructions until a condition occurs. A loop construct typically includes a loop header and a body. The body includes one or more instructions that are executed until the condition occurs. The loop header is one or more instructions whose execution results in the data processing system making a choice as to which of two or more different dataflow paths of the application are followed. The loop header typically defines the condition that causes the data processing system to perform the loop body. Examples of loop constructs include, but are not limited to, a "for next" loop, a "while" loop, an "if-then" construct, an "if-then-else" construct, and so forth.

In block 325, the system can determine whether the loop construct meets one or more modification conditions. If so, method 300 can continue to block 330. If not, method 300 can loop back to block 315 to check for another occurrence of the enumerated operation within the application. A modification condition refers to a property of a loop construct of an application. Modification conditions are described in greater detail herein with reference to FIG. 4. In one example, the system determines whether the loop construct, including the enumerated operation in the loop body, implements a counter operation. If so, the system determines that the loop construct meets the modification condition(s).

Continuing with block 330, the system is capable of modifying the loop construct. The system changes the loop construct to generate a modified loop construct. The modified loop construct includes one or more instructions that are different instructions than used in the original loop construct. The modified loop construct is functionally equivalent to the original loop construct.

In one aspect, the system is capable of modifying or rewriting the original loop construct by adding, removing, and/or changing instructions. In another aspect, the system is capable of generating a new loop construct as the modified loop construct. The system replaces the original loop construct within the application, whether in source code form or in IR form, with the modified loop construct. After block 330, method 300 can loop back to block 315 to continue processing.

For purposes of illustration, consider the case where the enumerated operation is a modulo operation within an instruction where the loop construct effectively implements a counter. The instruction including the enumerated construct can be within the body of the loop construct. The system can modify the loop construct to calculate the enumerated operation (in this example a modulo operation) as a compile time constant as opposed to performing the enumerated operation within the body of the loop which occurs during execution of the loop. The resulting modified loop construct is functionally equivalent to the loop construct. In the modified loop construct, the modulo operation is determined one time during compilation (e.g., during a phase of design flow in the case of a circuit design). The system can perform a same or similar process where the enumerated operation is a division operation.

In block 335, the system can generate the circuit design. The system can generate an RTL version of the application, using the modified loop construct(s). The system can generate the circuit design from the HLL version of the application including the modified loop construct(s) or from the IR of the application using the modified loop constructs in IR form.

The system can perform one or more other operations on the circuit design once generated. For example, the system can perform synthesis, placement, routing, and/or bitstream generation on the circuit design. Synthesis refers to the process of converting, or translating, a circuit design (e.g., expressed as an RTL description using an HDL) into a low-level design implementation. The low-level design implementation of the circuit design generated through synthesis typically is specified as inter-connected logic gates or as a netlist.

Synthesis may also include mapping. Mapping is the process of correlating, or matching, the logic gates of the low-level circuit design to the various types of physical circuit blocks that are actually available in the particular IC in which the circuit design is to be implemented called the "target IC." For example, since a lookup table (LUT) may implement a complex function, one or more logic gates of the low-level circuit design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned.

Routing is the process of selecting particular routing resources such as wires, PIPs, PIP settings, and/or other interconnect circuitry to electrically couple the various circuit blocks of the target IC after placement. Bitstream generation converts the routed circuit design into a configuration bitstream that can be loaded into a target IC thereby physically implementing the circuit design within the target IC.

Method 300 may be performed multiple times. For example, method 300 may be performed a first time where the enumerated operation is a modulo operation. Method 300 may be performed a second time where the enumerated operation is a division operation. It should be appreciated that the order in which enumerated operations are processed, e.g., whether modulo first and division second or division first and modulo second, is not intended as a limitations of the embodiments described herein.

Figure 4:
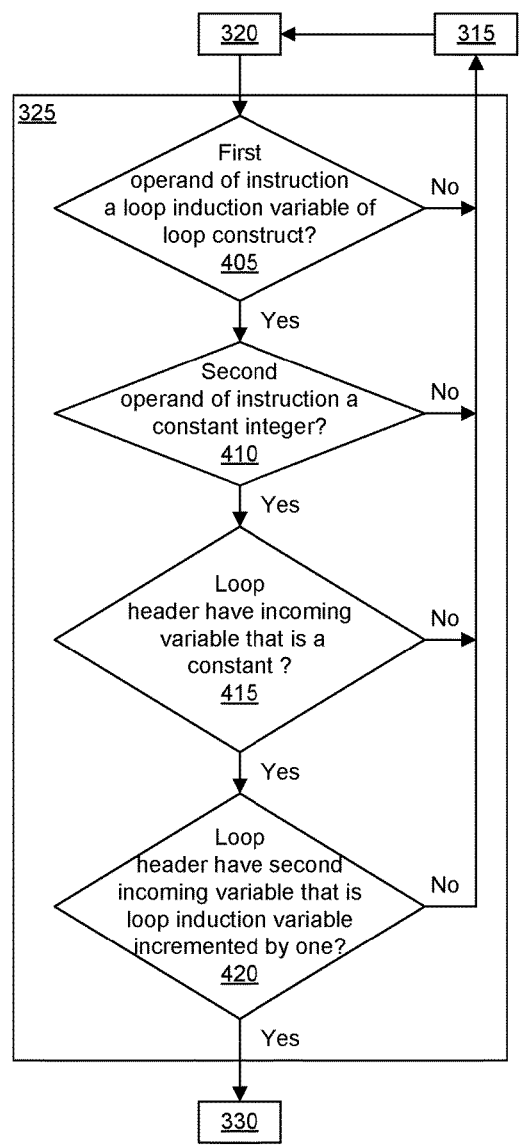
FIG. 4 is a flow chart illustrating an example implementation of block 325 of FIG. 3.

FIG. 4 is a flow chart illustrating an example implementation of block 325 of FIG. 3. In block 405, the system can determine whether a first operand of the instruction including the enumerated operation is a loop induction variable of the loop construct. For example, in the case of a modulo operation or a division operation, the system determines whether the dividend of the enumerated operation is the loop induction variable. If so, the method can continue to block 410. If not, the method can loop back to block 315.

In block 410, the system can determine whether the second operand of the instruction including the enumerated operation is a constant integer. For example, in the case of the modulo operation or the division operation, the system can determine whether the divisor of the enumerated operation is a constant integer. If so, the method can continue to block 415. If not, the method can loop back to block 315.

In block 415, the system can determine the loop header of the loop construct has a first incoming variable that is a constant. In one example embodiment, where the application is translated into an IR, the system can determine whether a phi node associated with the loop header of the loop construct has a first incoming variable that is a constant in the loop header of the loop construct. If so, the method can continue to block 420. If not, the method can loop back to block 315.

In block 420, the system can determine whether the loop header of the loop construct has a second incoming variable that is the loop induction variable incremented by one. In one example embodiment, where the application is translated into an IR, the system can determine whether the phi node associated with the loop header of the loop construct has a second incoming variable that is the loop induction variable incremented by one. If so, the method can proceed to block 330. If not, the method can loop back to block 315.

Example 1 illustrates a loop construct in HLL source code that can be processed as described with reference to FIGS. 3 and 4 by system 100. The program code of Example 1 includes a modulo operation represented by the symbol "%".

Example 1

```
for (int i=C0; i<N; ++i) {
    a[i % C1]=b[i];
}
```

In Example 1, the modulo operation is an enumerated operation that is detected by the system. The system can determine that the modulo operation is located within an instruction that is within a loop construct. More particularly, the system is capable of determining that the modulo operation is within an instruction that is within the body of the loop construct.

Further, the first operand (e.g., the dividend) of the instruction that includes the enumerated operation, e.g., "a[i % C1]=b[i];", is "i". The dividend "i" is the loop induction variable of the loop construct. The second operation (e.g., the divisor) of the instruction "a[i % C1]=b[i];" is C1. The divisor is a constant. The phi node associated with the loop header (e.g., for (int i=C0; i<N; ++i) {) has an incoming variable that is a constant (C0). The phi node associated with the loop header has a further incoming variable that is the loop induction variable incremented by one, e.g., "++i." Blocks 415 and 420 indicate that the system detects two incoming variables for the phi node. In another example, the system can determine that the phi node has only the two incoming variable described. Otherwise, the system can skip processing of the loop construct.

A review of Example 1 illustrates that the loop construct implements a counter using the modulo operation within the loop body. Example 2 illustrates the loop construct in modified form after processing the loop construct of Example 1 through FIGS. 3 and 4.

Example 2

```
for (int i=C0, NA=C0%C1; i<N; ++i) {
    a[NA]=b[i];
    NA=(NA<C1-1) ? (NA+1): 0;
```

As shown, the enumerated operation, e.g., the modulo operation, is moved out of the body of the loop construct and into the loop header of the loop construct. As such, the modulo operation is calculated as a compile time constant. Further, the counter operation is now performed by the instruction "NA=(NA<C1-1) ? (NA+1): 0;". The instruction increments a value stored in "NA" until the value is no longer less than "C1-1". At the point where "NA<C1-1" is false, the system sets the value of NA to 0, e.g., the counter rolls over.

The circuit design generated from Example 2 requires fewer resources and has less latency than the circuit design generated from Example 1. The circuit designs are functionally equivalent, as are Example 1 and Example 2. Still, by removing the modulo operation from the body and transforming the modulo operation to a compile time constant, the resulting circuit design is changed and improved in terms of resource utilization and latency.

For example, the modulo operation is often processed through a design flow or at least synthesized into an RTL instance that performs a remainder calculation. This instance can utilize a large number of resources on the target IC and exhibit significant latency. In designs with partitioned arrays, the modulo operator can be found in a loop construct where the first operand is the induction variable and the second operand is loop invariant. Loop constructs processed through high level synthesis can be transformed into a canonical loop with an induction variable that is incremented by a stride of 1 after each iteration. In such cases, the modulo operation can be transformed to a combination of simpler instructions that reduce the resource utilization (e.g., and often area) and the latency of the resulting circuit design.

Example 3 illustrates another loop construct in HLL source code that can be processed as described with reference to FIGS. 3 and 4 by system 100. The program code of Example 3 includes a division operation represented by the symbol "/".

Example 3

```
for (int i=C0; i<N; ++i) {
    a[i/C1]=b[i];
}
```

In Example 3, the division operation is an enumerated operation that is detected by the system. The system can determine that the division operation is located within an instruction that is within a loop construct. More particularly, the system can determine that the division operation is within an instruction that is within the body of the loop construct.

Further, the first operand (e.g., the dividend) of the instruction that includes the enumerated operation, e.g., "a[i/C1]=b[i];", is "i". The dividend "i" is the loop induction variable of the loop construct. The second operand (e.g., the divisor) of the instruction "a[i/C1]=b[i];" is C1. The divisor is a constant. The phi node associated with the loop header (e.g., for (int i=C0; i<N; ++i) {}) has an incoming variable that is a constant (C0). The phi node associated with the loop header has a further incoming variable that is the loop induction variable incremented by one, e.g., "++i." Blocks 415 and 420 indicate that the system detects two incoming variables for the phi node. In another example, the system can determine that the phi node has only the two incoming variables described. Otherwise, the system can skip processing of the loop construct.

A review of Example 3 illustrates that the loop construct implements a counter using the division operation within the loop body. Example 4 illustrates the loop construct in modified form after processing the loop construct of Example 3 through FIGS. 3 and 4.

Example 4

```
for (int i=C0, NA=C0/C1, NA2=(C0+1)%C1; i<N; ++i) {
    a[NA]=b[i];
    NA=NA2==0 ? (NA+1): NA;
    NA2=(NA2<C1-1) ? (NA2+1): 0;
}
```

As shown, the enumerated operation, e.g., the division operation, is moved out of the body of the loop construct and into the loop header of the loop construct. As such, the division operation is calculated as a compile time constant. Further, the counter operation is now performed by the instructions "NA=NA2==0 ? (NA+1): NA;" and "NA2=(NA<C1-1) ? (NA2+1): 0;".

The circuit design generated from Example 4 requires fewer resources and has less latency than the circuit design generated from Example 3. The circuit designs are functionally equivalent, as are Example 3 and Example 4. Still, by removing the division operation from the body and transforming the division operation to a compile time constant, the resulting circuit design is changed and improved in terms of resource utilization and latency.

Example 5 illustrates an optional interim processing operation that may be performed by the system. In Example 5, the system replaces the division operation illustrated in Example 3 with a modulo operation to arrive at the program code (e.g., modified construct) of Example 5. The system may then continue processing the modulo operation of Example 5 to generate the final modified construct illustrated above in Example 4. It should be appreciated, however, that the system may proceed directly from Example 3 to generating Example 4 without the interim processing step illustrated in Example 5.

Example 5

```
for (int i=C0, NA=C0/C1; i<N; ++i) {
    a[NA]=b[i];
    NA=(i+1) % C1==0 ? (NA+1): NA;
}
```

Example 6 is pseudocode illustrating an example embodiment for performing HLS on an application in IR form. The modulo operation, in IR form, is implemented using the "urem" instruction. It should be appreciated that while Example 6 is described with reference to the "urem" instruction, the pseudocode may also be applied to the IR representation of loop construct having a division operation as described herein.

Example 6

```
For each loop L in module M (the intermediate representation of the design)
    get canonical induction variable and assign canonical induction variable
        to IV (Induction Variable)
    for each instruction I in loop L
        if I is not a urem instruction
            continue;
        else if (first operand of I is IV and second operand of I is a
            constant integer C1 and phi node IV has two incoming values
            where one is a constant integer C0 from the loop header and
            the other one is the induction variable + 1 from loop latch)
            assign C1 mod C0 to C;
            create a new phi node instruction PN with empty incoming
                values;
            insert PN before the first non-phi-node instruction in loop
                header;
            create a new add instruction NA with first operand PN and
                second operand 1;
            insert NA before the first non-phi-node instruction in loop
                latch;
            create a new icmp instruction NC with condition code ult
                and first operand NA and second operand C1;
            insert NC after NA;
            create a new select instruction NS with condition NC and
                first value NA and second value 0;
            insert NS after NC;
            add first incoming value [C, pre-header of L] to PN;
            add second incoming value [NS, latch of L] to PN;
            replace all uses of I with PN;
            erase I from its basic block;
        endif
    end
end
```

The operations described can be carried out in a high level synthesis compiling process to replace the enumerated instruction (whether in HLL source code or IR form) with one or more simpler instructions. In the case of processing the application in IR form, the system can convert the enumerated instruction into: a phi node, an "add" instruction, an "icmp" instruction, and a "select" instruction. The area and latency in the circuit design generated from performing high level synthesis is reduced due to the described modifications.

From the example pseudo code illustrated above, a modulo instruction (e.g., a "urem" instruction in IR) or a division instruction, is replaceable if the first operand (dividend) is the loop induction variable, the second operand (divisor) is a constant integer, and the loop induction variable phi node has two incoming values where one incoming value of the phi node is a constant integer from the loop header and the other incoming value is the induction variable increased by 1. When the second operand of the "urem" instruction or division instruction is a variable, the second variable is replaceable if the second variable is loop invariant and the constant integer from the loop header in one of the incoming values of the induction variable is zero.

Example 7 illustrates a loop construct in IR form. The program code of Example 7 is SSA compliant. Further, the program code of Example 7 is in an original state, e.g., prior to performing any processing as described with reference to method 300 and/or the procedure illustrated in Example 6. As noted, in IR form, the "urem" instruction implements the modulo operation. While the "urem" instruction is used in Example 7, it should be appreciated that the inventive arrangements may be applied where the instruction is a division instruction.

Example 7

```
1   ; <label>:1                          ; preds = %3, %0
2     %i = phi i10 [ 0, %0 ], [ %i.1, %3 ]     ; [#uses=4 type=i10]
3     %exitcond = icmp eq i10 %i, -24, !dbg !37   ; [#uses=1 type=i1]
      [debug line = 2:17]
4     br i1 %exitcond, label %4, label %3, !dbg !37  ;
      [debug line = 2:17]
5   ; <label>:3                          ; preds = %1
6     %tmp = zext i10 %i to i64, !dbg !40      ; [#uses=1 type=i64]
      [debug line = 3:5]
7     %b.addr = getelementptr [1000 x i32]* %b, i64 0, i64 %trip, !dbg
      !40 ; [#uses=1 type=i32*][debug line = 3:5]
8     %b.load = load i32* %b.addr, align 4, !dbg !40 ; [#uses=1 type=i32]
      [debug line = 3:5]
9     %tmp.1 = urem i10 %i, 29, !dbg !40       ; [#uses=1 type=i10]
      [debug line = 3:5]
10    %tmp.2 = zext i10 %tmp.1 to i64, !dbg !40  ; [#uses=1 type=i64]
      [debug line = 3:5]
11    %a.addr = getelementptr [1000 x i32]* %a, i64 0, i64 %tmp.2, !dbg
      !40 ; [#uses=1 type=i32][debug line = 3:5]
12    store i32 %b.load, i32* %a.addr, align 4, !dbg !40 ;
      [debug line = 3:5]
13    %i.1 = add i10 %i, 1, !dbg !42           ; [#uses=1 type=i10]
      [debug line = 2:29]
14    br label %1, !dbg !42
```

Within Example 7, the "urem" instruction of line 9 exists within a loop construct as illustrated by the phi node in line 2. The IR program code of Example 7 includes two blocks. The first block is denoted by "<label>:1" in line 1. The second block is denoted by "<label>:3" in line 5. The first block is the loop header. The first block, for example, correlates to an instruction such as "for (int i=C0; i<N; ++i) {" in HLL source code. The second block corresponds to the loop body as previously described herein. In Example 7, the second block (e.g., the loop body) performs memory assignment using the modulo operation to calculate an address. The first block updates the loop induction variable and checks the loop condition to continue or exit.

Example 8 illustrates the state of the IR program code of Example 7 post processing where the system has applied the operations described by the pseudocode of Example 6. Example 8 illustrates the loop construct in IR form. The program code of Example 8 is SSA compliant.

Example 8

```
1   ; <label>:1                          ; preds = %2, %0
2     %i = phi i10 [ 0, %0 ], [ %i_1, %2 ]     ; [#uses=3 type=i10]
3     %phi_urem = phi i10 [ 0, %0 ], [ %idx_urem, %2 ] ;
      [#uses=2 type=i10]
4     %exitcond = icmp eq i10 %i, -24, !dbg !32   ; [#uses=1 type=i1]
      [debug line = 2:17]
5     %i_1 = add i10 %i, 1, !dbg !35           ; [#uses=1 type=i10][debug
      line = 2:29]
6     br i1 %exitcond, label %3, label %2, !dbg !32  ; [debug
      line = 2:17]
7   ; <label>:2                          ; preds = %1
8     %next_urem = add i10 %phi_urem, 1        ; [#uses=2 type=i10]
9       %tmp_1 = icmp ult i10 %next_urem, 29    ; [#uses=1 type=i1]
10      %idx_urem = select i1 %tmp_1, i10 %next_urem, i10 0 ;
      [#uses=1 type=i10]
11    %tmp = zext i10 %i to i64, !dbg !36        ; [#uses=1 type=i64]
      [debug line = 3:5]
12    %b_addr = getelementptr [1000 x i32]* %b, i64 0, i64 %tmp, !dbg
      !36 ; [#uses=1 type=i32*][debug line = 3:5]
13    %b_load = load i32* %b_addr, align 4, !dbg !36  ; [#uses=1
      type=i32][debug line = 3:5]
14    %tmp_2 = zext i10 %phi_urem to i64, !dbg !36  ; [#uses=1
      type=i64][debug line = 3:5]
15    %a_addr = getelementptr [1000 x i32]* %a, i64 0, i64 %tmp_2,
      !dbg !36 ; [#uses=1 type=i32*][debug line = 3:5]
16    store i32 %b_load, i32* %a_addr, align 4, !dbg !36  ; [debug
      line = 3:5]
17    br label %1, !dbg !35
```

The system, in processing the IR program code of Example 7, determines that the "urem" instruction of line 9 meets the conditions where the first operand of the instruction I is the induction variable, second operand of the instruction is a constant integer C1 (e.g., 29), and the phi node IV (referring to line 2 of Example 7) has two incoming values where one is a constant integer C0 from the loop header and the other one is the induction variable+1 from loop latch. Accordingly, the system assigns C1 mod C0 to C, creates a new phi node instruction, and inserts the phi node instruction before the first non-phi node in the loop header as illustrated in line 3 of Example 8. The system further creates a new "add" instruction with the first operand PN and second operand 1 and inserts the new "add" instruction before the first non-phi-node instruction in the loop latch (e.g., loop body) as shown in line 8. The system creates a new "icmp" instruction with condition code "ult" and first operand (e.g., "%next_urem") and second operand C1 (e.g., "29"). The system inserts the new "icmp" instruction after the new "add" instruction (e.g., lines 8 and 9). The system further creates a new "select" instruction with the condition of the new "icmp" instruction, the first value of the new "add" instruction, and a second value of 0. The system inserts the new "select" instruction after the new "icmp" instruction at line 10. The system performs the remainder of the operation of Example 6 as described, including replacing all uses of instruction I with the phi node instruction and erasing the instruction I from the basic block (e.g., loop body).

Subsequent to the processing described, the IR program code of Example 8 has a new phi node at line 2 that implements a counter. The loop body updates the counter when the condition(s) are met.

Example 9 is RTL that is generated from the loop construct program code (whether in HLL or IR) prior to processing. As illustrated below, the RTL of Example 9 includes a "urem IP core" that is instantiated and used.

Example 9

```
dut_urem_10 ns_6 ns_10_14 #(
  .ID(1),
  .NUM_STAGE(14),
  .din0_WIDTH(10),
  .din1_WIDTH(6),
  .dout_WIDTH(10))
dut_urem_10 ns_6 ns_10_14_U1(
  .clk(ap_clk),
  .reset(ap_rst),
  .din0(i_phi_fu_67_p4),
  .din1(grp_fu_87_p1),
  .ce(grp_fu_87_ce),
  .dout(grp_fu_87_p2)
);
```

Example 10 is RTL that is generated from the processed program code (whether HLL or IR) post processing as described with reference to FIG. 3 or Example 6. In the RTL of Example 10, the "urem IP core" is no longer instantiated. Instead, the "urem IP core" is replaced with the RTL shown below.

Example 10

```
assign      idx_urem_fu_117_p3=((tmp_1_fu_111_
  p2[0:0]===1'b1) ? next_urem_fu_105_p2: ap_const_
  lv10_0);
assign      next_urem_fu_105_p2=(phi_urem_reg_76+
  ap_const_lv10_1);
assign tmp_1_fu_111_p2=((next_urem_fu_105_p2<ap_
  const_lv10_1D) ? 1'b1:1'b0);
```

Processing the RTL of Example 9 and the RTL of Example 10 through design flows for implementation within a target IC results in significantly different circuit structures. In particular, the urem IP cores that are instantiated in Example 9 require significant resource utilization (and large area) and have more latency than the circuit structures that are implemented by the RTL of Example 10. For example, whereas the RTL of Example 9 instantiates the "urem IP core," the RTL of Example 10 implements counters at a reduced cost in terms of resource utilization and latency.

The example embodiments described herein can be used to transform explicit enumerated operations on induction variables and implicit enumerated operations caused by array partition pragmas in HLL designs, e.g., in C, C++, and/or OpenCL designs, into simpler instructions. For example, the enumerated operations can be replaced as described as part of a front end high level synthesis process used to implement one or more transforms of an application.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined within this disclosure, the term "circuit design" means one or more register transfer level (RTL) description modules. A circuit design may refer to an entire circuit design that includes user specified RTL; one or more cores and/or intellectual properties (IPs); a combination of user specified RTL, cores, and/or IP; a single IP and/or core (e.g., a reusable portion of RTL); or the like. As defined within this disclosure, the term "module" means a unit of RTL. A module is a defined construct within the syntax of the particular hardware description language (HDL) used to express the RTL description and is part of a hierarchical organization of modules forming the circuit design.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output"

means storing in physical memory elements, e.g., devices, writing to display or other peripheral output device, sending or transmitting to another system, exporting, or the like. As defined herein, the term "plurality" means two or more than two.

As defined herein, the term "hardware description language" or "HDL" is a computer-language that facilitates the documentation, design, and manufacturing of a digital system, such as an integrated circuit. A hardware description language combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system. Examples of HDL include VHDL and Verilog.

As defined herein, the term "high level programming language" or "HLL" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, and so forth.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of high level synthesis can include detecting, using a processor, an enumerated operation within an instruction of a loop construct of an application, determining, using the processor, whether the loop construct meets a modification condition, and responsive to determining that the loop construct meets the modification condition, modifying, using the processor, the loop construct to calculate the enumerated operation as a compile time constant. The modified loop construct is functionally equivalent to the loop construct.

The method can include first translating the application into an intermediate representation prior to the detecting.

In one aspect, the instruction including the enumerated operation is within a body of the loop construct and the modifying removes the instruction from the body of the loop construct.

The modification condition can specify that a dividend of the enumerated operation is a loop induction variable of the loop construct.

The modification condition can specify that a divisor of the enumerated operation is a constant integer.

The modification condition can specify that a phi node of the loop construct has a first incoming variable that is a constant specified in a loop header of the loop construct and a second incoming variable that is the loop induction variable incremented by one.

The loop construct and the modified loop construct can each implement a counter. Further, the enumerated operation can be a modulo operation or a division operation.

A system includes a processor configured to initiate executable operations for high level synthesis. The executable operations can include detecting an enumerated operation within an instruction of a loop construct of an application, determining whether the loop construct meets a modification condition, and responsive to determining that the loop construct meets the modification condition, modifying the loop construct to calculate the enumerated operation as a compile time constant. The modified loop construct is functionally equivalent to the loop construct.

The processor is configured to initiate executable operations further including first translating the application into an intermediate representation prior to the detecting.

In one aspect, the instruction including the enumerated operation is within a body of the loop construct and the modifying removes the instruction from the body of the loop construct.

The modification condition can specify that a dividend of the enumerated operation is a loop induction variable of the loop construct.

The modification condition can specify that a divisor of the enumerated operation is a constant integer.

The modification condition can specify that a phi node of the loop construct has a first incoming variable that is a constant specified in a loop header of the loop construct and a second incoming variable that is the loop induction variable incremented by one.

The loop construct and the modified loop construct can each implement a counter. Further, the enumerated operation can be a modulo operation or a division operation.

A computer program product includes a computer readable storage medium having program code stored thereon. The program code is executable by a processor to perform operations for high level synthesis. The operations include detecting, using the processor, an enumerated operation within an instruction of a loop construct of an application, determining, using the processor, whether the loop construct meets a modification condition, and responsive to determining that the loop construct meets the modification condition, modifying, using the processor, the loop construct to calculate the enumerated operation as a compile time constant. The modified loop construct is functionally equivalent to the loop construct.

The program code can be executable by the processor to perform operations including first translating the application into an intermediate representation prior to the detecting.

In one aspect, the instruction including the enumerated operation is within a body of the loop construct and the modifying removes the instruction from the body of the loop construct.

The modification condition can specify that a dividend of the enumerated operation is a loop induction variable of the loop construct.

The modification condition can specify that a divisor of the enumerated operation is a constant integer.

The modification condition can specify that a phi node of the loop construct has a first incoming variable that is a constant specified in a loop header of the loop construct and a second incoming variable that is the loop induction variable incremented by one.

The loop construct and the modified loop construct can each implement a counter. Further, the enumerated operation can be a modulo operation or a division operation.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of high level synthesis for a circuit design, the method comprising:
   translating, using a processor, an application into an intermediate representation;
   detecting in the intermediate representation, using the processor, an enumerated operation within an instruction within a body of a loop construct of the application, wherein the enumerated operation is a modulo operation or a division operation;
   determining, using the processor, whether the loop construct meets a modification condition specifying that the enumerated operation involves a loop induction variable of the loop construct, and a phi node of the loop construct has a first incoming variable that is a constant specified in a loop header of the loop construct and a second incoming variable that is the loop induction variable incremented by one;
   responsive to determining that the loop construct meets the modification condition, modifying, using the processor, the loop construct by calculating the enumerated operation as a compile time constant and inserting the compile time constant into a loop header of the loop construct, wherein the modified loop construct is functionally equivalent to the loop construct; and
   generating, using the processor, the circuit design from the application including the modified loop construct.

2. The method of claim 1, wherein the modifying further comprises:
   removing the instruction from the body of the loop construct; and
   adding at least one additional instruction to the body of the loop construct.

3. The method of claim 1, wherein the modification condition specifies that a dividend of the enumerated operation is the loop induction variable of the loop construct.

4. The method of claim 3, wherein the modification condition specifies that a divisor of the enumerated operation is a constant integer.

5. The method of claim 1, wherein the loop construct and the modified loop construct each implement a counter.

6. A system comprising a processor configured to initiate executable operations for high level synthesis for a circuit design, the executable operations comprising:
   translating an application into an intermediate representation;
   detecting, in the intermediate representation, an enumerated operation within an instruction within a body of a loop construct of the application, wherein the enumerated operation is a modulo operation or a division operation;
   determining whether the loop construct meets a modification condition specifying that the enumerated operation involves a loop induction variable of the loop construct, and a phi node of the loop construct has a first incoming variable that is a constant specified in a loop header of the loop construct and a second incoming variable that is the loop induction variable incremented by one;
   responsive to determining that the loop construct meets the modification condition, modifying the loop construct by calculating the enumerated operation as a compile time constant and inserting the compile time constant into a loop header of the loop construct, wherein the modified loop construct is functionally equivalent to the loop construct; and
   generating the circuit design from the application including the modified loop construct.

7. The system of claim 6, wherein the modifying further comprises:
   removing the instruction from the body of the loop construct; and
   adding at least one additional instruction to the body of the loop construct.

8. The system of claim 6, wherein the modification condition specifies that a dividend of the enumerated operation is the loop induction variable of the loop construct.

9. The system of claim 8, wherein the modification condition specifies that a divisor of the enumerated operation is a constant integer.

10. The system of claim 6, wherein the loop construct and the modified loop construct each implement a counter.

11. A computer program product comprising a computer readable storage medium having program code stored thereon, the program code executable by a processor to perform operations for high level synthesis for a circuit design, the operations comprising:
   translating an application into an intermediate representation;
   detecting, in the intermediate representation, an enumerated operation within an instruction within a body of a loop construct of the application, wherein the enumerated operation is a modulo operation or a division operation;
   determining whether the loop construct meets a modification condition specifying that the enumerated operation involves a loop induction variable of the loop construct, and phi node of the loop construct has a first incoming variable that is a constant specified in a loop header of the loop construct and a second incoming variable that is the loop induction variable incremented by one;

responsive to determining that the loop construct meets the modification condition, modifying the loop construct by calculating the enumerated operation as a compile time constant and inserting the compile time constant into a loop header of the loop construct, wherein the modified loop construct is functionally equivalent to the loop construct; and generating the circuit design from the application including the modified loop construct.

12. The computer program product of claim 11, wherein the loop construct and the modified loop construct each implement a counter.

13. The computer program product of claim 11, wherein the modifying further comprises:

removing the instruction from the body of the loop construct; and adding at least one additional instruction to the body of the loop construct.

14. The computer program product of claim 11, wherein the modification condition specifies that a dividend of the enumerated operation is the loop induction variable of the loop construct.

15. The computer program product of claim 14, wherein the modification condition specifies that a divisor of the enumerated operation is a constant integer.

* * * * *